United States Patent
Meyers et al.

(10) Patent No.: US 10,051,752 B1
(45) Date of Patent: Aug. 14, 2018

(54) TAPE SPRING KICKSTAND

(71) Applicant: Dell Products L.P., Round Rock, TX (US)

(72) Inventors: David Michael Meyers, Round Rock, TX (US); Jason Scott Morrison, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/430,884

(22) Filed: Feb. 13, 2017

(51) Int. Cl.
*H05K 5/02* (2006.01)
*G06F 1/16* (2006.01)

(52) U.S. Cl.
CPC ......... *H05K 5/0234* (2013.01); *G06F 1/1656* (2013.01)

(58) Field of Classification Search
CPC .............................. H05K 5/0234; G06F 1/1656
See application file for complete search history.

(56) References Cited

U.S. PATENT DOCUMENTS

| | | | |
|---|---|---|---|
| 9,689,524 B2* | 6/2017 | Martin | F16M 11/2021 |
| 2011/0164358 A1* | 7/2011 | Duan | H04M 1/04 |
| | | | 361/679.01 |
| 2013/0229100 A1* | 9/2013 | Siddiqui | G06F 1/1618 |
| | | | 312/326 |
| 2015/0108313 A1* | 4/2015 | Leung | H05K 5/0204 |
| | | | 248/351 |
| 2015/0211676 A1* | 7/2015 | Martin | G06F 1/1601 |
| | | | 361/679.01 |
| 2015/0359328 A1* | 12/2015 | van Hooft | A47B 23/043 |
| | | | 248/456 |
| 2016/0219734 A1* | 7/2016 | Wang | H05K 5/0234 |
| 2016/0224071 A1* | 8/2016 | Knepper | G06F 1/1681 |
| 2016/0286016 A1* | 9/2016 | Lee | H04M 1/04 |
| 2017/0135235 A1* | 5/2017 | Mercier | H05K 5/0234 |

* cited by examiner

*Primary Examiner* — Hoa C Nguyen
*Assistant Examiner* — Keith Depew
(74) *Attorney, Agent, or Firm* — Baker Botts L.L.P.

(57) ABSTRACT

Systems and methods are disclosed for coupling a tape spring kickstand to a housing portion of an information handling system. The information handling system includes a housing portion, a kickstand base rotationally coupled to the housing portion, and a tape spring coupled to the kickstand base and the housing portion, the tape spring comprising a bi-stable structure having an engaged and a disengaged position, the tape spring configured to transition to the engaged position as the kickstand base is rotated from the housing portion.

20 Claims, 6 Drawing Sheets

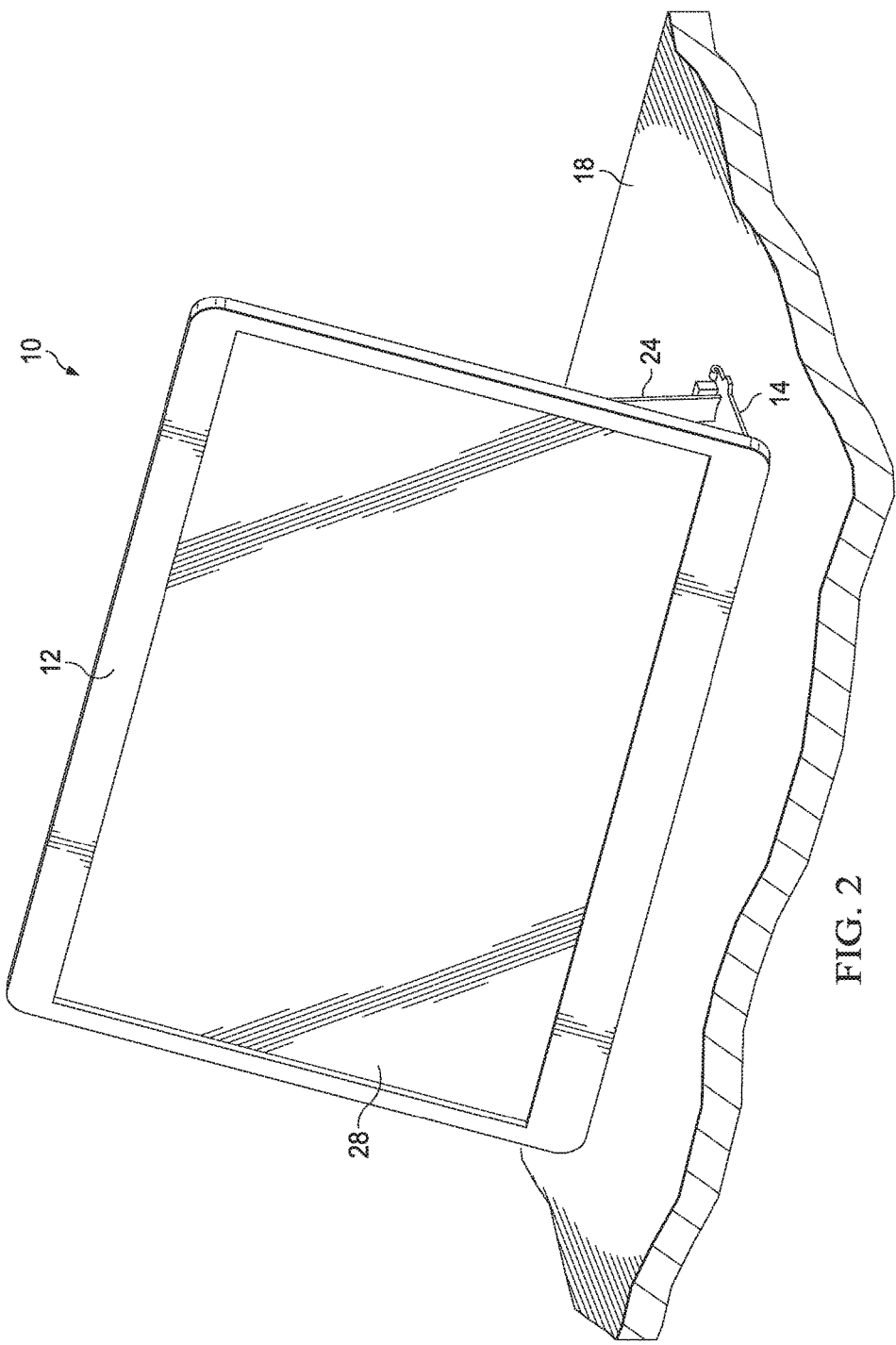

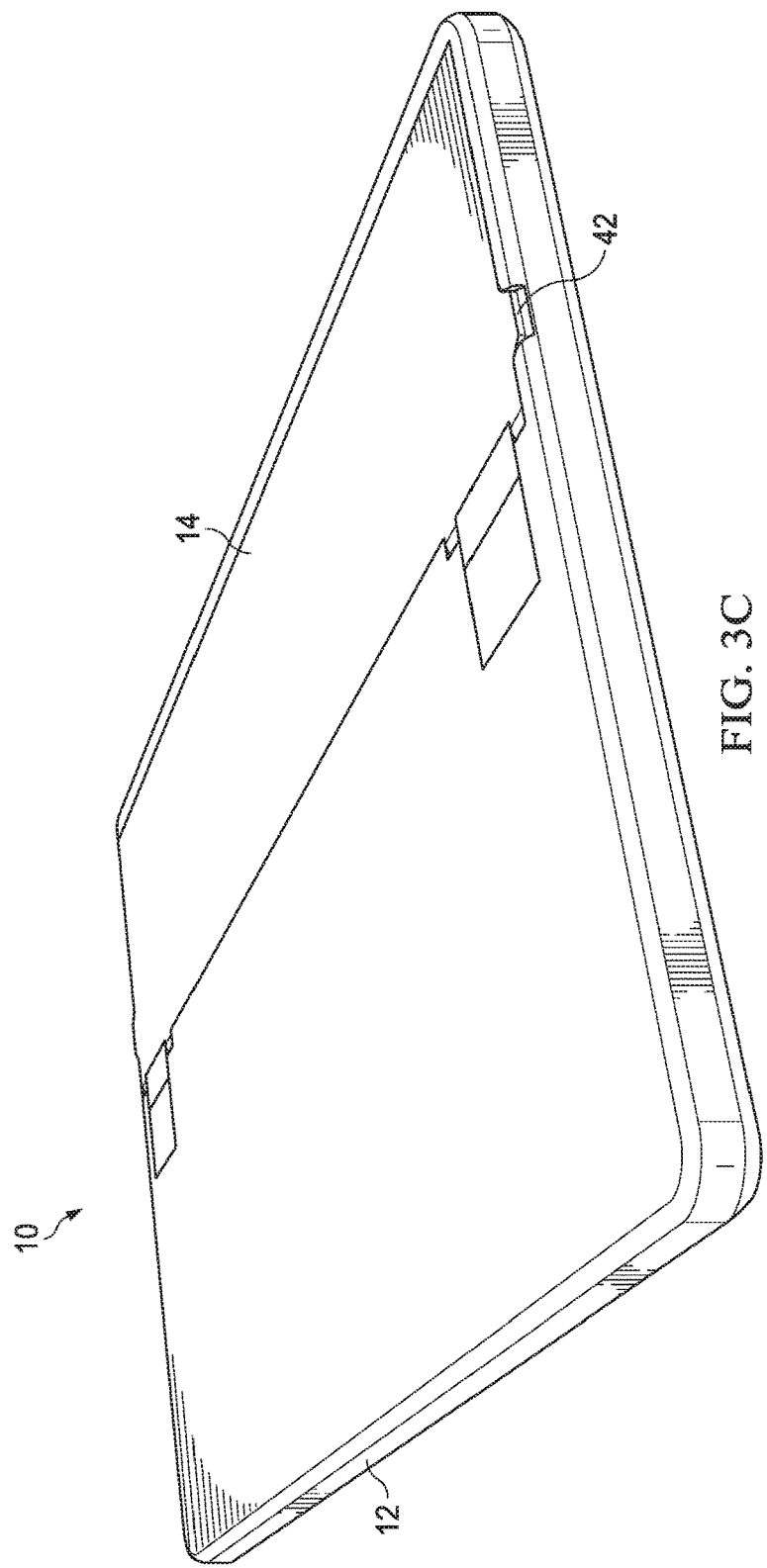

TAPE SPRING KICKSTAND

TECHNICAL FIELD

This disclosure relates generally to information handling systems and, more particularly, to an adjustable tape spring kickstand.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Examples of information handling systems include portable information handling systems, such as, smart phones, tablet computers, notebook computers, media players, digital cameras, 2-in-1 tablet-laptop combination computers, wireless organizers, and/or combinations thereof. A portable information handling system may generally be any device that a user may carry for handheld use and that includes a processor.

A portable information handling system may be configured to different positions in order to facilitate viewing, input, and interaction with the system. Portable information handling systems may include a kickstand to support the system in one or more configurations, including, for example, supporting the system to stand upright on a surface. Consumer demand has driven advancements in packaging design to reduce both the weight and thickness of portable information handling systems. Accordingly, there is a need for a kickstand to support the use of portable information handling systems that has minimal impact on the weight and thickness of portable information handling systems while providing stable and durable configurability of the systems.

SUMMARY

In some embodiments, an information handling system is disclosed that includes a housing portion. The information handling system also includes a kickstand base rotationally coupled to the housing portion. The information handling system further includes a tape spring coupled to the kickstand base and the housing portion, the tape spring comprising a bi-stable structure having an engaged and a disengaged position, the tape spring configured to transition to the engaged position as the kickstand base is rotated from the housing portion.

In another embodiment, a method is disclosed that includes rotationally coupling a housing portion to a kickstand base. The method also includes coupling a tape spring to the kickstand base and the housing portion, the tape spring comprising a bi-stable structure having an engaged and a disengaged position, the tape spring configured to transition to the engaged position as the kickstand base is rotated from the housing portion.

In a further embodiment, a kickstand assembly for an information handling system that includes a kickstand base rotationally coupled to a housing portion of the information handling system. The kickstand assembly also includes a first tape spring coupled to the kickstand base and the housing portion. The kickstand assembly further includes a second tape spring coupled to the kickstand base and the housing portion, the first and second tape springs comprising a bi-stable structure having an engaged and a disengaged position, the first and second tape springs configured to transition to the engaged position as the kickstand base is rotated from the housing portion

BRIEF DESCRIPTION OF THE DRAWINGS

For a more complete understanding of the present invention and its features and advantages, reference is now made to the following description, taken in conjunction with the accompanying drawings, in which:

FIG. 2 illustrates a perspective view of a portable information handling system with a tape spring kickstand;

FIG. 3C illustrates a perspective view of a portable information handling system with a tape spring kickstand in a closed position.

DETAILED DESCRIPTION

Figure 1:
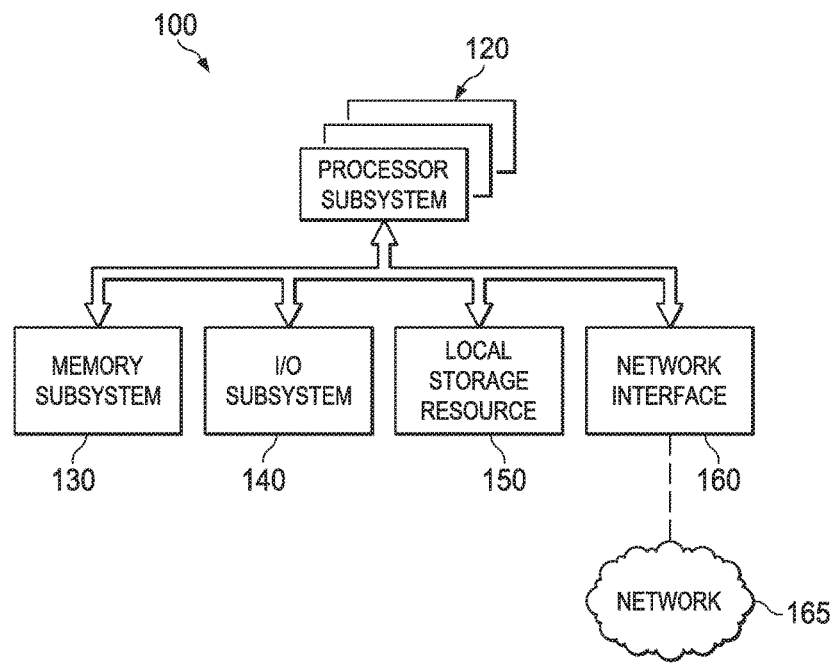
FIG. 1 illustrates a block diagram of selected elements of an embodiment of a portable information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, widget "72-1" refers to an instance of a widget class, which may be referred to collectively as widgets "72" and any one of which may be referred to generically as a widget "72."

As explained above, a portable information handling system may include a kickstand to support the use of the information handling system in one or more positions. For example, in open position, the kickstand may extend from the information handling system to allow the system to stand at an angle relative to a surface. The angle formed by the kickstand in open position may facilitate user input and interaction with the information handling system. In closed position, the kickstand may fold back to the information handling system. As described in more detail below, the kickstand may be designed to have minimal impact on the weight, thickness, and/or portability of the information handling system.

For the purposes of this disclosure, an information handling system may include an instrumentality or an aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a server, a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Particular embodiments are best understood by reference to FIGS. 1-4 wherein like numbers are used to indicate like and corresponding parts.

FIG. 1 illustrates a block diagram of selected elements of an embodiment of a portable information handling system 100 in accordance with some embodiments of the present disclosure. In various embodiments, portable information handling system 100 may represent different types of portable information handling systems, such as, smart phones, tablet computers, notebook computers, media players, digital cameras, 2-in-1 tablet-laptop combination computers, and wireless organizers. Components of portable information handling system 100 may include, but are not limited to, processor subsystem 120, which may comprise one or more processors, and system bus 121 that communicatively couples various system components to processor subsystem 120 including, for example, memory subsystem 130, I/O subsystem 140, local storage resource 150, and network interface 160. External or remote elements, such as network 165, are also shown to give context to an environment in which portable information handling system 100 may be configured to operate.

Processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130). In the same or alternative embodiments, processor subsystem 120 may interpret and/or execute program instructions and/or process data stored remotely (e.g., in a network storage resource, not shown).

System bus 121 may represent a variety of suitable types of bus structures, including for example, a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, PCI bus, PCI-E bus, HyperTransport (HT) bus, Integrated Interchip Sound (IIS) bus, Serial Peripheral Interface (SPI) bus, and Video Electronics Standards Association (VESA) local bus, among others. Although illustrated as a single bus in FIG. 1, system bus 121 may be implemented as a combination of one or more suitable busses, and in some embodiments, various components may use one or more different busses to communicate with other components of portable information handling system 100.

Memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as portable information handling system 100, is powered down.

In portable information handling system 100, I/O subsystem 140 may comprise a system, device, or apparatus generally operable to receive and/or transmit data to/from/within portable information handling system 100. I/O subsystem 140 may represent, for example, a variety of communication interfaces, graphics interfaces, video interfaces, user input interfaces, and/or peripheral interfaces. For example, I/O subsystem 140 may comprise a touch panel and display adapter. The touch panel (not shown) may include circuitry for enabling touch functionality in conjunction with a display (not shown) that is driven by display adapter (not shown).

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. For example, local storage resource 150 may store executable code in the form of program files that may be loaded into memory 130 for execution. In addition to local storage resources 150, in some embodiments, portable information handling system 100 may communicatively couple via network 165 to a network storage resource (not shown) using network interface 160 discussed below.

Network interface 160 may be a suitable system, apparatus, or device operable to serve as an interface between portable information handling system 100 and network 165. Network interface 160 may enable portable information handling system 100 to communicate over network 165 using any suitable transmission protocol and/or standard, including, but not limited to various transmission protocols and/or standards. Network 165 coupled to network interface 160 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data or information). In some embodiments, network 165 communicatively coupled to network interface 160 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 165, network interface 160, and/or various components associated therewith may be implemented using hardware, software, or any combination thereof. Network interface 160 may enable wired and/or wireless communications to and/or from portable information handling system 100.

FIG. 2 illustrates a perspective view of a portable information handling system with a tape spring kickstand. In the example embodiment, main housing portion 12 couples to kickstand base 14 to support various configurations of the system. More specifically, kickstand base 14 extends at an angle from main housing portion 12. When extended, kickstand base 14 may rest on surface 18 to support portable information handling system 10 upright relative to surface 18

Main housing portion 12 may include one or more components of the portable information handling system, including but not limited to processor subsystem 120, system bus 121, memory subsystem 130, I/O subsystem 140, local storage resource 150, and network interface 160 discussed above with respect to FIG. 1. In some embodiments, portable information handling system 10 may include one or more displays for visually presenting information and/or accepting user input. For example, display 28 may be a touch panel with circuitry enabling touch functionality in conjunction with a display such that a user may provide input to portable information handling system 10 through the display.

As explained in further detail below, kickstand base 14 may rotationally couple to main housing portion 12. One or more tape springs 24 may extend between kickstand base 14 and main housing portion 12. As kickstand base 14 rotates relative to couple to main housing portion 12, tape springs 24 may extend at different distances from main housing portion 12 in order to support and stabilize portable information handling system 10 in various positions with kickstand base 14.

Figure 2A:
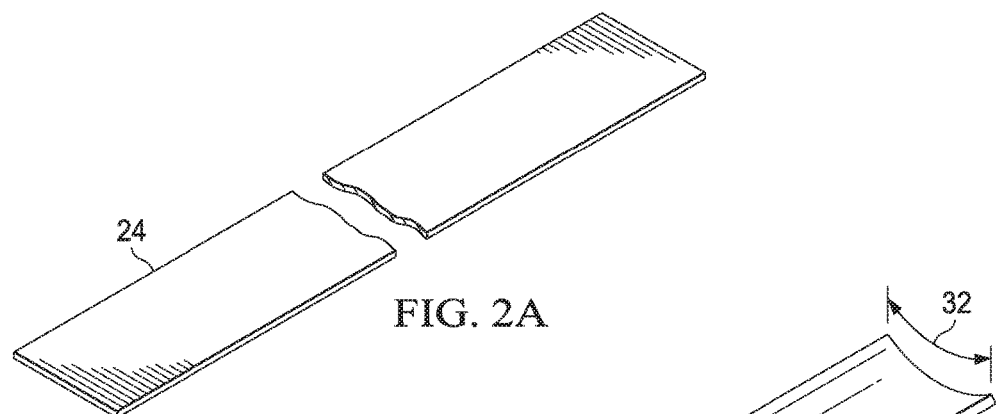
FIG. 2A illustrates a tape spring in disengaged position.
Figure 2B:
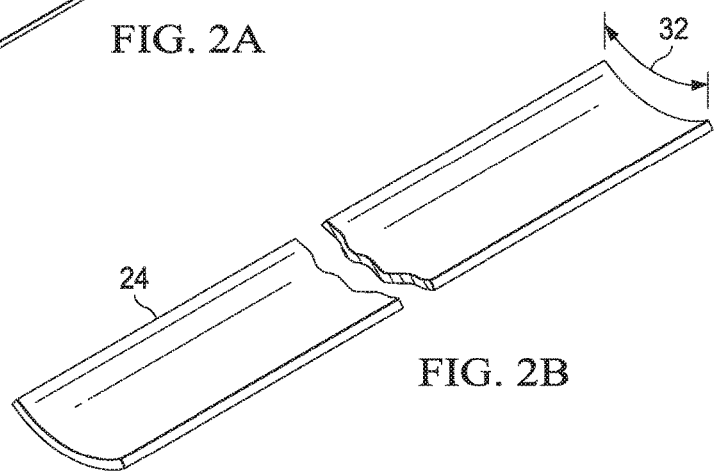
FIG. 2B illustrates a tape spring in engaged position.

Tape spring 24 may be a bi-stable structure formed of an curvature axis that may be engaged and disengaged. FIG. 2A illustrates a tape spring in disengaged position. Tape spring 24 may be formed of a resilient flexible material that folds or lays flat in disengaged position. Tape spring 24 may be comprised of a carbon fiber or Kevlar™ composite, tempered or spring steel, and/or other resilient flexible materials. The materials of tape spring 24 may be manufactured or processed such that the tape folds flat in a disengaged position. In disengaged position, tape spring 24 may be easily manipulated (e.g., bent, folded, rolled, etc.) in shape or form. FIG. 2B illustrates a tape spring in an engaged position. Tape spring 24 includes a widthwise curve, illustrated by widthwise curve 32. As the widthwise curve of tape spring 24 is engaged, the widthwise curve forms tape spring 24 into a rigid lengthwise structure. In engaged position, tape spring 24 forms rigid into a lengthwise straight position that can support one or more forces at either lengthwise end of tape spring 24 to, for example, support the weight of portable information handling system 10 as it rest in an open position relative to kickstand base 14 as shown in FIG. 2. The stability and operation of tap spring 24 may depend on the material, thickness, dimensions, curve, and/or curvature axes of the snapping band.

Figure 3A:
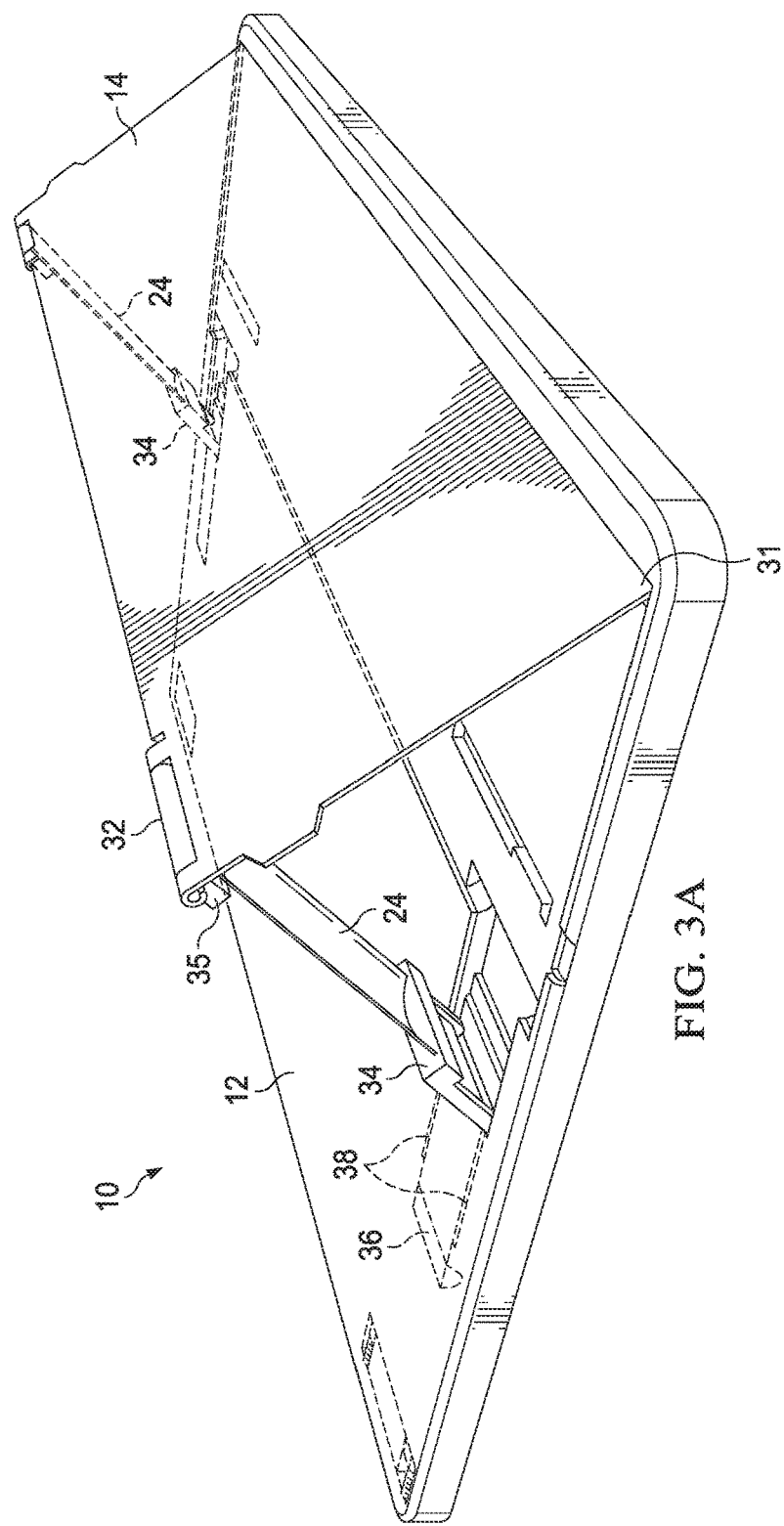
FIG. 3A illustrates a perspective view of a portable information handling system with a tape spring kickstand in extended position.
Figure 3B:
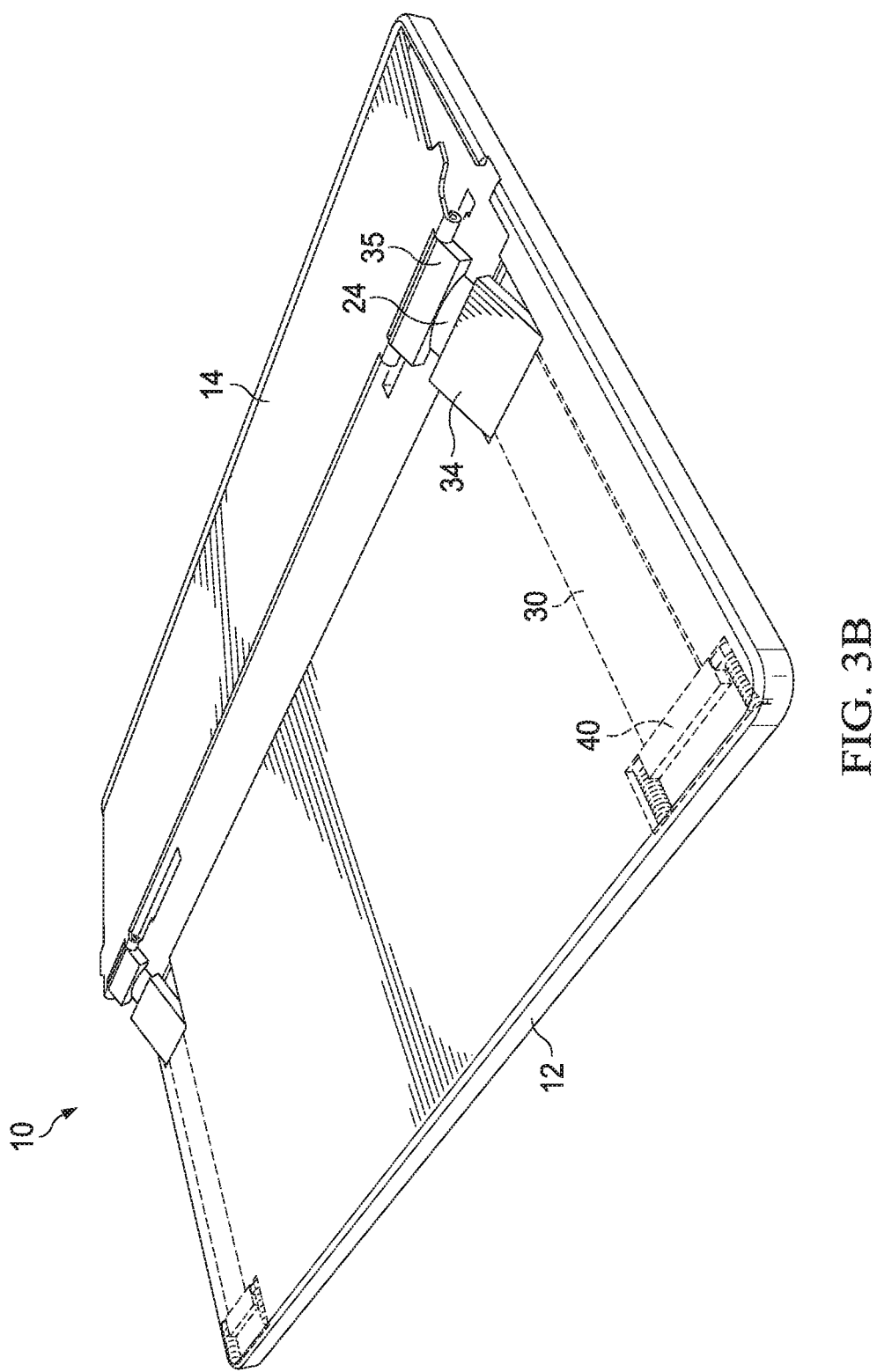
FIG. 3B illustrates a perspective view of a portable information handling system with a tape spring kickstand in a partially extended position.

FIGS. 3A-C illustrate a portable information handling system with a tape spring kickstand in various positions.

FIG. 3A illustrates a perspective view of a portable information handling system with a tape spring kickstand in extended position. Kickstand base 14 is illustrated in extended position in FIG. 3A such that kickstand base 14 may support main housing portion 12 in an upright position. Main housing portion 12 couples to kickstand base 14 via hinge 31 and tape springs 24. Kickstand base 14 may be rotated to a particular position relative to main housing portion 12 in order to achieve a desired position for portable information handling system 10.

Kickstand base 14 may comprise any structure to support portable information handling system 10. In some embodiments, kickstand base 14 may be comprised of a rigid material, such as plastic, metal, or carbon fiber. In use, kickstand base 14 may provide a surface to support main housing portion 12 at a particular angle relative to another surface. For example, kickstand base 14 may be used to configure main housing portion 12 in an upright position as illustrated in FIG. 2. Although kickstand base 14 is illustrated as a contiguous, solid rectangular shaped structure in FIG. 3A, kickstand base 14 may be include any shape or size, and may be comprised of multiple structures coupled together. The material, size, and shape of kickstand base 14 may be selected based on weight, functionality, design, durability, and/or other considerations.

In some embodiments, main housing portion 12 may rotatably couple to kickstand base 14. Hinge 31 may include any device that allows kickstand base 14 to rotate relative to main housing portion 14. In certain embodiments, hinge 31 may include a pin joint hinge such that kickstand base 14 may rotate freely relative to main housing portion 12. In other embodiments, hinge 31 may restrict the angle of rotation such that kickstand base 14 has limited range of angles at which it can rotate relative to main housing portion 12. In some embodiments, hinge 31 may include variable resistance that, for example, adds resistance against the rotation of kickstand base 14 at certain angles. In some embodiments, multiple hinges 31 may be used to couple main housing portion 12 to kickstand base 14. The number, type, and configuration of hinges 31 may be selected based on the design, functionality, material, durability, and/or other considerations.

One or more tape springs 24 may also couple kickstand base 14 to main housing portion 12. Tape springs 24 may provide structural support to kickstand base 14 when the kickstand is in use. Tape springs 24 may extend between kickstand base 14 and main housing portion 12 in order to support kickstand base 14 at a particular angle relative to main housing portion 12. For example, when main housing portion 12 is placed in an upright position on a surface (e.g., as illustrated in FIG. 2), kickstand base 14 may rest on the surface and tape springs 24 may support the main housing portion 12 in order to maintain portable information handling system 10 at a desired angle relative to the surface.

Tape spring 24 may extend from main housing portion 12 at different distances based on the position of kickstand base 14. As kickstand base 14 rotates open from main housing portion 12, tape spring 24 may extend between main housing portion 12 and kickstand base 14. A portion of tape spring 24 may store within main housing portion 12. For example, main housing portion 12 may include a space or cavity for storing tape spring 24. As kickstand base 14 is rotated open from main housing portion 12, tape spring 24 may slide out from main housing portion 12 to support kickstand base 14. Tape spring 24 may retract or slide back into main housing portion 12 as kickstand base 14 is rotated closed. In some embodiments, main housing portion 12 may include one or more guides 38 for tape spring 24. Guides 38 may include any structure capable of controlling the position of tape spring 24 as the tape spring moves within main housing portion 12. Guides 38 may ensure the alignment of tape spring 24 as it moves in and out of main housing portion 12. In some embodiments, guide 38 may include a plastic, metal, or carbon fiber structure physically coupled to main housing portion 12. In certain embodiments, guide 38 may be formed from the material comprising main housing portion 12.

As discussed above with respect to FIGS. 2A and 2B, tape spring 24 may be a bi-stable structure formed of a curvature axes. Tape spring 24 may be in engaged position when extended between main housing portion 12 and kickstand base 14. In engaged position, the widthwise curve of tape spring 24 maintains the tape spring in a rigid structure capable of supporting the weight of main housing portion 12 as sits on kickstand base 14. The size, shape, thickness, material, and or placement of tape spring 24 may selected based on a desired operation, performance, durability, cost, and/or performance of the tape spring kickstand. In some embodiments, tape spring 24 may be treated or covered in a material to achieve a desired design, safety, durability, and/or performance of the tape spring.

In some embodiments, engagement of tape spring 24 may be controlled by one or more shaping devices. Shaping device 34 may include any device or apparatus capable of transitioning tape spring 24 between engaged and/or disengaged position. In some embodiments, tape spring 24 may pass through shaping device 34 as it slides or extends from main housing portion 12 (e.g., when kick stand 14 is rotated open from main housing portion 12). Passing through shaping device 34 may cause tape spring 24 to engage or disengage. For example, shaping device 34 may include a widthwise curved shape that engages the widthwise curve of tape spring 24. As kickstand base 14 is rotated open, portions of tape spring 24 may pass through shaping device 34 causing the portions of tape spring 24 to engage (e.g., as illustrated in FIG. 2B). The engaged portion of tape spring 24 may extend from main housing portion 12 to kickstand base 14. In engaged position, tape spring 24 may maintain a rigid structure capable of supporting the weight of main housing portion 12 with kickstand base 14. As kickstand base 14 is rotated closed, portions of tape spring 24 may pass through shaping device 34 in the opposite direction and transition to disengaged position (e.g., as illustrated in FIG. 2A). In some embodiments, shaping device 34 may rotatably couple to main housing portion 12 such that tape spring 24 may remain substantially straight between main housing portion 12 and kickstand base 14 as the kickstand is opened and/or closed. In certain embodiments, shaping device 34 may rotatably couple to main housing portion 12 via a pin joint hinge such that shaping device 34 may rotate freely relative to main housing portion 12.

In some embodiments, the movement of tape spring 24 may be controlled in one or more manners. For example, friction may control the sliding of tape spring 24 in and out of main housing portion 12. As explained above, portions of tape spring 24 within main housing portion 12 may be in disengaged position (e.g., as illustrated in FIG. 2A). The widthwise curve of tape spring 24 may create friction between tape spring 24 and main housing portion 12. The friction between tape spring 24 and main housing portion 12 may depend on the space (e.g., dimensions, material, etc.) within main housing portion 12 in which tape spring 24 slides, and the material, dimensions, and/or design of tape spring 24. For example, the narrower or thinner the space within main housing portion 12 that tape spring 24 slides in and out of, the more friction that may exist between tape spring 24 and main housing portion 12. Friction may also exist between tape spring 24 and shaping device 34 such that shaping device 34 also affects the movement of tape spring 24 in and out of main housing portion 12. Friction between tape spring 24 and main housing portion 12 and/or shaping device 34 may control the amount of force required to slide tape spring 24 in or out of main housing portion 12. Such friction with tape spring 24 may stabilize kickstand base 14 in a particular position relative to main housing portion 12.

In addition to friction, other devices may be used to control the movement of tape spring 24 in and out of main housing portion 12. For example, tape spring 24 may include one or more notches that engage with one or more teeth on main housing portion 12 as tape spring 24 is slid out of main housing portion 12. The notches and teeth may prevent tape spring 24 from sliding back into main housing portion 12 thereby stabilizing portable information handling system 10 as it rests on kickstand base 14. A release button may disengage the teeth of main housing portion 12 to allow tape spring 24 to slide back into main housing portion 12. Other methods may be used to control the movement of tape spring 24 in combination or in lieu of those discussed above.

In some embodiments, tape spring 24 may rotatably couple to kickstand base 14 via hinge 32. Hinge 32 may include any device that allows tape spring 24 to rotate relative to kickstand base 14. As kickstand base 14 is rotated to different positions relative to main housing portion 12, hinge 32 may allow tape spring 24 to rotate at different angles relative to kickstand base 14. In certain embodiments, hinge 32 may include a pin joint hinge such that tape spring 24 may rotate freely relative to kickstand base 14. The type, and configuration of hinge 32 may be selected based on design, functionality, material, durability, and/or other considerations. Hinge 32 may include or be coupled to a shaping device, similar to shaping device 34 described above. For example, shaping device 35 may include any device or apparatus capable of maintaining a portion of tape spring 24 at or near kickstand base 14 in an engaged position. Shaping device 35 may shape a portion of tape spring 24 at or near kickstand base 14 in an engaged position. As explained above, portions of tape spring 24 may engage as they pass through shaping device 34. Shaping devices 34 and 35 may maintain the portions of tape spring 24 between main housing portion 12 and kickstand base 14 in an engaged position.

Portable information handling system 10 may include a device to control the maximum distance the tape spring 24 extends from main housing portion 12. The distance that tape spring 24 extends from main housing portion 12 may change as kickstand base 14 is rotated between different positions from main housing portion 12. In some embodiments, a cap may be formed at or attached to a portion of tape spring 24. For example, cap 36 may attach to an end of tape spring 24 such that it prevents tape spring 24 from extending beyond a certain distance from main housing portion 12. In some embodiments, cap 36 may be a plastic, metal, and/or carbon fiber structure physically coupled to or formed at an end of tape spring 24. Cap 36 may be shaped and/or sized such that it catches on a portion of main housing portion 12 to prevent tape spring 24 from fully exiting main housing portion 12. Thus, cap 36 may be used to control the maximum distance that tape spring 24 extends from main housing portion 12.

FIG. 3B illustrates a perspective view of a portable information handling system with a tape spring kickstand in a partially extended position. Kickstand base 14 is supported by tape spring 24 such that main housing portion 12 may be placed at an angle relative to a surface. Compared to FIG. 3A, kickstand base 14 in FIG. 3B is extended less distance from main housing portion 12 such that it results in a smaller angle between kickstand base 14 and main housing portion 12.

As explained above with respect to FIG. 3A, friction may affect the movement of tape spring 24 in and out of main housing portion 12. In some embodiments, the amount of friction between tape spring 24 and main housing portion 12 may vary depending on the portions of tape spring 24 within main housing portion 12. For example, friction between main housing portion 12 and tape spring 24 may increase as more of tape spring 24 is slid into contact with main housing portion 12. Thus, friction with tape spring 24 may increase as kickstand base 14 is moved from open to closed position such that kickstand base 14 may become more difficult to rotate opened or closed.

In some embodiments, main housing portion 12 may include a device to offset friction with tape spring 24. Assisting device 40 may be any device or apparatus that provides a force to counter the friction between tape spring 24 and main housing portion 12. For example, assisting device 40 may include a spring that compresses as tape spring 24 moves into main housing portion 12. The compression of the spring in assisting device 40 may produce a force that offsets some of the friction between tape spring 24 and main housing portion 12. The offsetting force from assisting device 40 may make it easier for a user to open and close kickstand base 14 despite the increased friction between tape spring 24 and main housing portion 12 as kickstand base 14 is closed. In some embodiments, assisting device 40 may be configured to engage based on the relative position of tape spring 24 and/or kickstand 14. For example, assisting device 40 may be configured to offset friction when kickstand base 14 is between approximately 0 and 15 degrees of rotation from main housing portion 12, and otherwise not affect the movement and/or operation of tape spring 24 when kickstand base 14 exceeds this angle of rotation from main housing portion 12.

FIG. 3C illustrates a perspective view of a portable information handling system with a tape spring kickstand in a closed position. In closed position, kickstand base 14 may fold into main housing portion 12 such that portable information handling system 10 assumes a substantially flat profile. Closed position may correspond with a user configuring portable information handling system 10 into a flat tablet mode in which kickstand base 14 is not needed. Tape springs 24 may retract or slide into main housing portion 12, and shaping device 34 may rotate substantially flat relative to main housing portion 12. In certain embodiments, a magnet, snap, and/or other device not expressly illustrated may be used to help hold kickstand base 14 in closed position. As explained above, in some embodiments, an assisting device 40 may be used to assist a user when rotating kickstand base 14 open from a closed position, which may be helpful in overcoming the force of any magnet, snap, and/or other device used to hold kickstand base 14 in closed position.

In some embodiments, tabs or pulls may be added to kickstand base 14 to assist with its opening. For example, one or more tabs 42 may extend from kickstand base 14 such that a user may easily pull kickstand base 14 open from a closed position. Tab 42 may be part of kickstand base 14 or coupled to kickstand base 14. In certain embodiments, main housing portion 12 may include a notch or space to accommodate tab 42 when kickstand base 14 is moved to closed position. The number, size, shape, and placement of tabs 42 may depend on the design, functionality, material, durability, friction, and/or other considerations associated with portable information handling system 10.

The tape spring kickstand in FIGS. 3A-C are provided for illustrative purposes. The inclusion, number, dimensions, placement, and materials of various elements comprising tape spring kickstand (e.g., kickstand base 14, tape spring 24, tab 42, hinge 31, hinge 32, guide 38, shaping device 34, cap 36, of FIGS. 3A-C) may be selected based on a desired operation, performance, durability, cost, and/or performance of the tape spring kickstand. For example, the elements may be selected to achieve a desired stability in the tape spring kickstand assembly, such that a certain minimum force is required to move the kickstand relative to the main housing portion. As another example, one or more elements may be added to synchronize the movement of the tape springs when multiple tape springs are used in the kickstand assembly.

Figure 4:
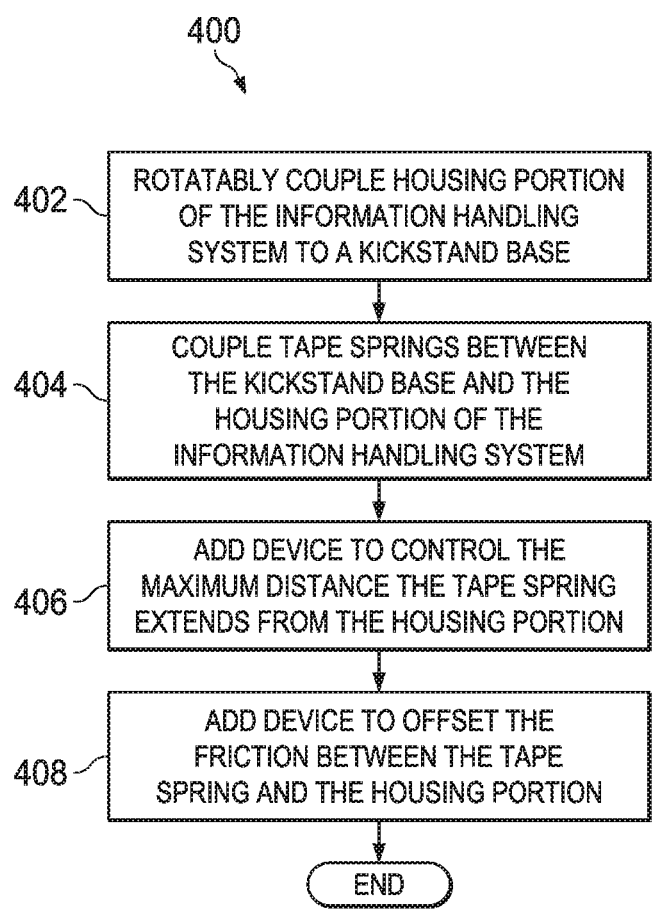
FIG. 4 illustrates a flowchart depicting selected elements of an embodiment of a method for coupling a tape spring kickstand to a housing portion of an information handling system.

FIG. 4 illustrates an example method 400 for coupling a tape spring kickstand to a housing portion of an information handling system. Method 400 may begin at step 402, where the housing portion of the information handling system is rotationally coupled to a kickstand base. The kickstand base may rotate to different positions relative to the housing portion, including for example, opened and closed positions discussed above with respect to FIGS. 3A-C. In some embodiments, the housing portion (e.g., main housing portion 12 illustrated in FIGS. 2-3) may couple to the kickstand base (e.g., kickstand base 14 illustrated in FIGS. 2-3) via a hinge (e.g., hinge 31 illustrated in FIGS. 3A-C).

In step 404, one or more tape springs may be coupled between the kickstand base and the housing portion of the information handling system. The tape springs may support the information handling system relative to the kickstand base such that the system may be placed in an upright position on a surface (e.g., as illustrated in FIG. 2). In some embodiments, the tape springs may be coupled to the base via a hinge as discussed above with respect to FIGS. 3A-C. The tape spring may slide in and out of the housing portion as the kickstand base is rotated to different positions relative to the housing portion. In certain embodiments, a shaping device (e.g., shaping device 34 discussed above with respect to FIG. 3A-C) may be used to transition the tape spring between engaged and/or disengaged position.

In step 406, one or more devices may be added to control the tape spring. For example, a device may be added to control the maximum distance the tape spring extends from the main housing portion. As explained above with respect to FIG. 3A, a cap may attach to an end of the tape spring such that it prevents the tape spring pulling fully out from the housing portion.

In step 408, a device may be added to offset the friction between the tape spring and the housing portion. As discussed above with respect to FIG. 3B, friction between the tape spring and the housing portion may affect the movement of the tape spring within the housing portion. As the kickstand base is moved to closed position, the friction between the tape spring and the housing portion may increase such that it becomes more difficult to move adjust the kickstand base. An assisting device (e.g., assisting device 40 described above with respect to FIG. 3B) may offset such friction and reduce the amount of force required to move the kickstand base. After step 408, method 400 may end.

Method 400 may be implemented in any suitable manner. It is noted that certain steps or operations described in method 400 may be optional or may be rearranged in different embodiments.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An information handling system comprising:
   a housing portion;
   a kickstand base rotationally coupled to the housing portion; and
   a tape spring coupled to the kickstand base and the housing portion, the tape spring comprising a bi-stable structure having an engaged and a disengaged position, the tape spring configured to transition to the engaged position as the kickstand base is rotated from the housing portion.

2. The system of claim 1, wherein the tape spring is further configured to transition to the disengaged position as the kickstand base is rotated toward the housing portion.

3. The system of claim 2, wherein the tape spring is further configured to slide into the housing portion as the kickstand base is rotated toward the housing portion.

4. The system of claim 3, wherein a friction between the tape spring and the housing portion controls the sliding of the tape spring into the housing portion.

5. The system of claim 1, wherein the information handling system further comprises a shaping device, the shaping device configured to engage a widthwise curve of the tape spring to transition the tape spring to the engaged position.

6. The system of claim 1, wherein the shaping device is rotationally coupled to the housing portion.

7. The system of claim 1, wherein the tape spring further comprises a cap, the cap configured to control a maximum distance that the tape spring extends from the housing portion.

8. The system of claim 1, wherein the kickstand base is configured to create a substantially flat surface with the housing portion when the kickstand base is in a closed position.

9. A method of coupling a tape spring kickstand to a housing portion of an information handling system, the method comprising:
   rotationally coupling a housing portion to a kickstand base; and
   coupling a tape spring to the kickstand base and the housing portion, the tape spring comprising a bi-stable structure having an engaged and a disengaged position, the tape spring configured to transition to the engaged position as the kickstand base is rotated from the housing portion.

10. The method of claim 9, wherein the tape spring is further configured to transition to the disengaged position as the kickstand base is rotated toward the housing portion.

11. The method of claim 10, wherein the tape spring is further configured to slide into the housing portion as the kickstand base is rotated toward the housing portion.

12. The method of claim 11, wherein a friction between the tape spring and the housing portion controls the sliding of the tape spring into the housing portion.

13. The method of claim 9, wherein the tape spring is configured to pass through a shaping device as the kickstand base is rotated from the housing portion, the shaping device configured to engage a widthwise curve of the tape spring to transition the tape spring to the engaged position.

14. The method of claim 13, wherein the shaping device is rotationally coupled to the housing portion.

15. The method of claim 9, wherein the tape spring further comprises a cap, the cap configured to control a maximum distance that the tape spring extends from the housing portion.

16. The method of claim 9, wherein the kickstand base is configured to create a substantially flat surface with the housing portion when the kickstand base is in a closed position.

17. A kickstand assembly for an information handling system, the kickstand assembly comprising:
   a kickstand base rotationally coupled to a housing portion of the information handling system;
   a first tape spring coupled to the kickstand base and the housing portion; and
   a second tape spring coupled to the kickstand base and the housing portion, the first and second tape springs comprising a bi-stable structure having an engaged and a disengaged position, the first and second tape springs configured to transition to the engaged position as the kickstand base is rotated from the housing portion.

18. The kickstand assembly of claim 17, wherein the kickstand base is configured to rotate from a closed position to an open position.

19. The kickstand assembly of claim 18, wherein the kickstand base is configured to support the housing portion in an upright position when the kickstand is in an open position.

20. The kickstand assembly of claim 18, wherein the kickstand base is configured to create a substantially flat surface with the housing portion when the kickstand base is in a closed position.

* * * * *